United States Patent [19]

Grutzmacher et al.

[11] Patent Number: 4,851,763
[45] Date of Patent: Jul. 25, 1989

[54] CURRENT-MEASURING DEVICE, ESPECIALLY FOR DETERMINING THE MOTOR CURRENT OF A DIRECT-CURRENT MOTOR

[75] Inventors: Bertold Grutzmacher, Schriesheim; Helmut Meyer, Dossenheim, both of Fed. Rep. of Germany

[73] Assignee: Heidelberger Druckmaschinen AG, Heidelberg, Fed. Rep. of Germany

[21] Appl. No.: 170,762

[22] Filed: Mar. 21, 1988

[30] Foreign Application Priority Data

Mar. 19, 1987 [DE] Fed. Rep. of Germany ....... 3708892

[51] Int. Cl.$^4$ .......................... G01R 1/20; G01R 1/02; G01R 19/00
[52] U.S. Cl. ................................. 324/127; 324/103 P; 324/117 R; 324/130
[58] Field of Search ............... 324/127, 117 R, 117 H, 324/102, 130, 103 P; 328/165; 307/520

[56] References Cited

U.S. PATENT DOCUMENTS

| | | | |
|---|---|---|---|
| 4,138,641 | 2/1979 | Karlin et al. | 324/117 H |
| 4,305,132 | 12/1981 | Tsuboshima et al. | 455/63 |
| 4,500,837 | 2/1985 | Shuey et al. | 324/102 |
| 4,556,842 | 12/1985 | Rosswurm | 324/102 |

*Primary Examiner*—Ernest F. Karlsen
*Attorney, Agent, or Firm*—Herbert L. Lerner; Laurence A. Greenberg

[57] ABSTRACT

Current-measuring device including a non-contacting current sensor and an evaluating device connected downstream to the sensor for producing an output signal proportional to a current being measured, comprising a circuit arrangement for determining a zero drift of at least one of the evaluating device and the current sensor from symmetrical components of the current being measured and for correcting the drift.

8 Claims, 2 Drawing Sheets

CURRENT-MEASURING DEVICE, ESPECIALLY FOR DETERMINING THE MOTOR CURRENT OF A DIRECT-CURRENT MOTOR

The invention relates to a current-measuring device, especially for determining the motor current of a direct-current motor, and more particularly, including a non-contacting current sensor and an evaluating device located downstream from the sensor for producing an output signal proportional to a current being measured.

Current-measuring devices which permit a potential-free measurement of a direct or alternating current are, for example, non-contacting current converters which sense the magnetic field of the current being measured and convert it in accordance with its intensity into electrical signals, for example with Hall-effect sensors. Usually, a very small voltage proportional to the current being measured is produced, which is amplified electronically. A measuring device of this type is, for example, a current converter of the series IB-5000 M made by the firm Cunz of Frankfurt, West Germany. As is generally known, such current converters have a zero-offset current which exhibits a given drift behavior. Such a zero drift is caused, for example, by a change in temperature, by aging or by a fluctuation in the supply voltage. Even though it is small, this zero drift considerably distorts the measurement result because of the relatively small data or useful signal which is produced by the sensor. Although it is possible, for example, to compensate for a temperature-induced zero drift with suitable circuits or components if the relationship between the temperature and the shift is known, this usually necessitates elaborate measures and costly expenditures, because the variations in materials mean that each example must be newly calibrated. It has therefore been impossible heretofore to compensate for the zero drift in a manner which takes all disturbing influences into account.

It is accordingly an object of the invention to provide a current-measuring device which makes it possible to compensate for zero drift regardless of the disturbing factor causing the zero drift to arise.

With the foregoing and other objects in view, there is provided in accordance with the invention, a non-contacting current sensor and an evaluating device connected downstream to the sensor for producing an output signal proportional to a current being measured, comprising a circuit arrangement for determining a zero drift of at least one of the evaluating device and the current sensor from symmetrical components of the current being measured and for correcting the drift.

An advantage of this arrangement is a completely independent stabilization and correction of the zero drift, which makes preliminary trimming or calibration superfluous. Furthermore, it is possible to stabilize or correct a zero drift caused not only by a single disturbance, but rather, the cause of which is to be found in any number of disturbances. It is thus possible, for example, to compensate for or stabilize rapid changes in the disturbances occurring as a result of fluctuations in the supply voltage as well as very slow changes in the disturbances, for example as a result of aging.

In accordance with another feature of the invention, the circuit arrangement includes a comparison circuit for determining a difference in peak values in positive and negative directions of the current being measured, the difference being a measure of the zero drift. From this difference, a downstream controller forms a correction value which is applied to the signal being measured, so that a closed control loop is formed. The zero drift is thereby reduced to a permissible value close to zero.

In accordance with a further feature of the invention, the current-measuring device includes means for storing the peak values and means for forming mean values of the peak values.

In accordance with an added feature of the invention, the current-measuring device includes a controller having an input for receiving a signal corresponding to the difference in the peak values and for forming a correction value for the zero drift.

In accordance with an additional feature of the invention, the current-measuring device includes a comparator for forming the sign of the difference in the peak values and a counter connected to the comparator for counting in a direction determined by the sign, the count of the counter serving as the correction value.

In accordance with again another feature of the invention, the current-measuring device includes means for maintaining the counter in its original state when the current has no symmetrical components.

In accordance with again a further feature of the invention, the current-measuring device is in combination with a four-quadrant power regulator for a resistive-inductive load comprising means for applying a d-c voltage via switching transistors at high frequencies and with varying clock relationship to the load for varying the intensity of the current flowing through the load. The control electronics in such regulators are not normally for the potential with which the power semiconductors are generally associated, particularly if the power semiconductors are connected to the system or network. In such a case, it is practical to determine the load-current intensity with an isolated measuring device of the type represented by the current-measuring according to the invention.

In accordance with a concomitant feature of the invention, the current being measured is the motor current of a direct-current motor.

Other features which are considered as characteristic for the invention are set forth in the appended claims.

Although the invention is illustrated and described herein as embodied in a current-measuring device, especially for determining the motor current of a direct-current motor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
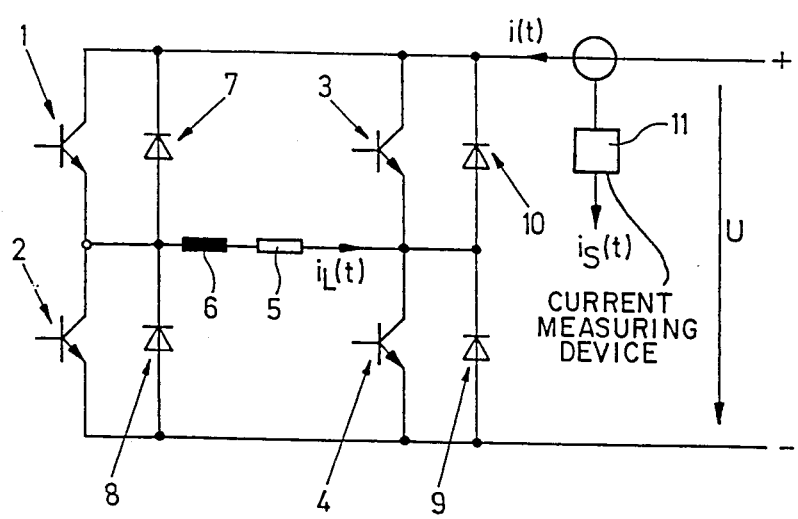
FIG. 1 is a circuit diagram of a four-quadrant d.c. chopper controller.
Figure 2:
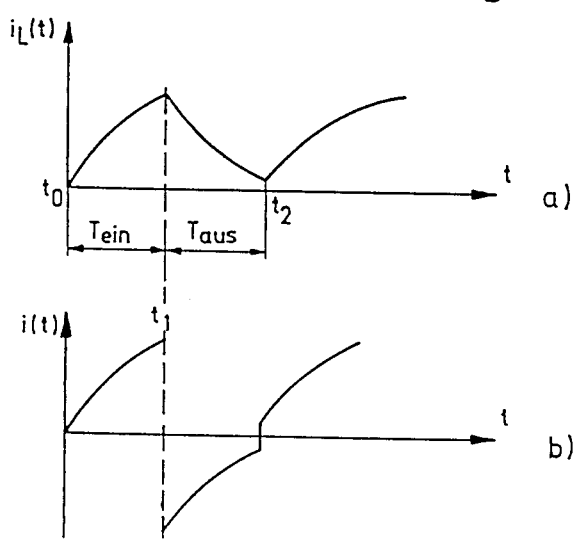
FIG. 2 is a plot diagram showing a characteristic curve of the motor-coil current as a function of time

Referring now to the drawing and first, particularly, to FIG. 1 thereof, there is shown therein a basic circuit of a transistor-switched four-quadrant d.c. chopper controller with resistive-inductive load. A non-illustrated conventional control circuit switches the transistors 1 to 4 in such a way that currents flow in alternating directions through a motor coil 5, which is connected to a resistor 6. Free-wheeling diodes 7 to 10 are connected in parallel with the transistors 1 to 4. A current $i_L(t)$ through the motor coil 5 in the direction of the arrow is produced when the transistors 1 and 4 are in a conducting state. A current in the opposite direction is formed by switching on the transistors 2 and 3. A current-measuring device 11 is provided for measuring current and, in a conventional manner, measures the input current $i(t)$ without any contact, for example, with a Hall sensor. To produce a given motor torque, the coil current is given a beat or is rhythmically clocked or chopped i.e. the switching transistors 1 to 4 are energized at a given frequency. FIG. 2a shows a characteristic curve of the motor current $i_L(t)$ as a function of time, while FIG. 2b shows a characteristic curve of the input current $i(t)$ as a function of time. If the switching transistors 1 and 4 are energized or triggered, then, starting from time $t_0$, the motor current $i_L$ rises, with a delay caused by inductivity, to the switch-off time $t_1$. After being switched off, the current flows on through the free wheeling diodes 8 and 10 and decays until the switching transistors 1 and 4 are again energized (time $t_2$) or until the current has reached the value of zero. According to FIG. 2b, the input current $i(t)$ has its positive peak at the time $t_1$ and changes its direction at the time of switch-off and is then fed back into the system. The transition from positive to negative input current or vice versa occurs abruptly, which means that, with the offset voltage of the current-measuring device 11 correctly set, the positive and negative edges of the current signal $i_s(t)$ are of equal magnitude at the time $t_1$. A deviation from this equality, therefore, can be used as a measure of the zero drift of the measuring device 11. The measured value $i_s(t)$ of the input current is used or displayed as a control variable for controlling the motor. By means of a suitable circuit, the difference between the two peak values of the input-current signal $i_s(t)$ can be determined and, with a downstream control circuit, the offset voltage and the zero drift, respectively, of the current-measuring device can be so influenced that the difference becomes less than a specified maximum value.

Figure 3:
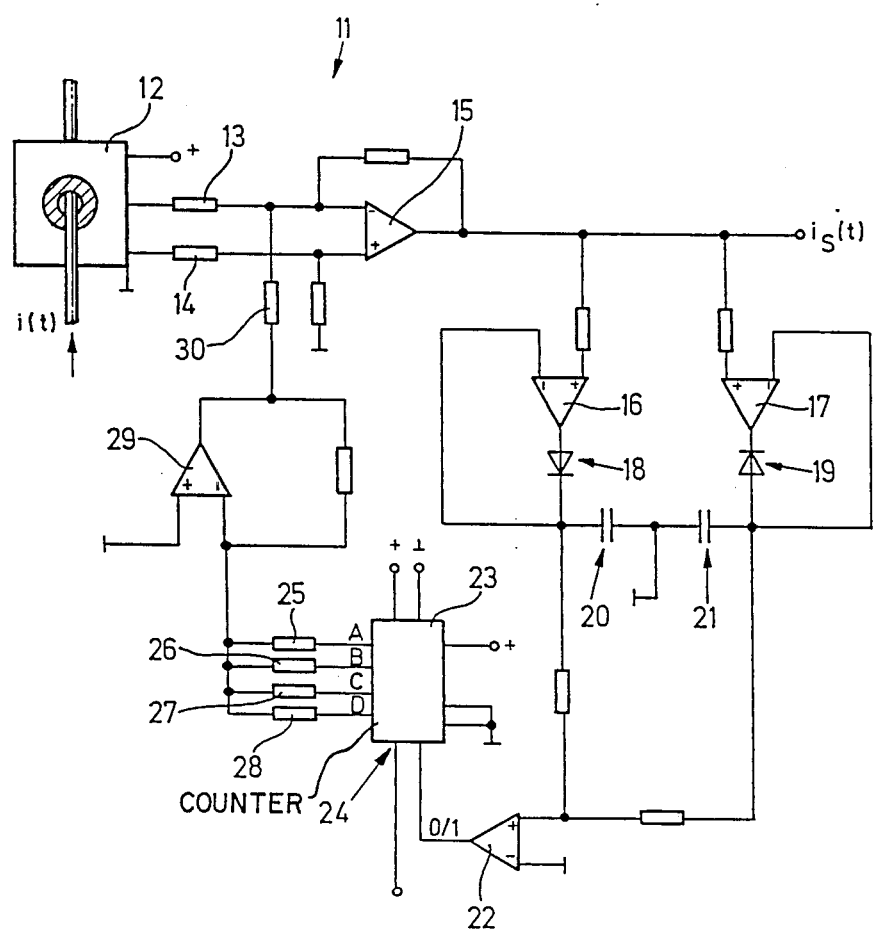
FIG. 3 is a diagram of a circuit arrangement for compensating for zero drift.

FIG. 3 shows a circuit arrangement for compensating for the zero drift. The input current $i(t)$ is measured by a sensor 12 of the current-measuring device 11 which feeds corresponding measured signals via series resistors 13 and 14 to an amplifier 15. The output signal $i_s(t)$ of the amplifier 15 is thus proportional to the input current $i(t)$ as shown in FIG. 2b. Due to an offset voltage of the sensor 12, however, the output signal $i_s(t)$ may have been shifted from zero by a given amount. This output signal $i_s(t)$ is then applied to two amplifiers 16 and 17, the output of which are provided with diodes 18 and 19 of different conducting directions. Connected to the outputs of the diodes 18 and 19 are capacitors 20 and 21 which are connected in common to ground at the free ends thereof. The positive edges of the current $i_s$ cause the charging of the capacitor 20, while the negative edges of the current $i_s$ causes the charging of the capacitor 21. The difference in the charging voltages of the two capacitors 20 and 21 is fed to a comparator 22. Depending upon the sign of the differential voltage, the comparator 22 forms an output signal 0 or 1, which is, in turn, fed to a counter 23. The counter 23 receives pulses of any desired frequency via a clock input 24. Depending upon the output signal of the differential amplifier or comparator 22, these pulses are counted up or down by the counter. Thus, a high level of the output signal of the differential amplifier 22 causes an increase in the output count of the counter, while a low level causes a decrease in the output count of the counter 23. The count of the counter 23 is applied to the outputs A, B, C and D of the counter 23 and is fed via respective resistors 25 to 28 to an inverting input of an amplifier 29. The resistors 25 to 28 are dimensioned or are rated so that, starting from the higher-value output, the resistance values are reduced by half per each output. In conjunction with the amplifier 29, therefore, the count of the counter 23 is converted into a correction value, which is present at the output of the amplifier 29 and is applied via a resistor 30 to the measured signal of the sensor 12. This correction value causes a shift in the output signal from the amplifier 15, in a manner that a zero symmetry is obtained. Thus, the measured value $i_s(t)$ of the input current $i(t)$ is no longer defectively subject to a zero drift and to an offset voltage, respectively, and therefore permits a very precise control of the motor current.

In an advantageous manner, the pulses fed to the clock input 24 may be derived from the energization or triggering signals for the switching transistors 1 to 4. This ensures that, in the case of intermittent clocking or chopping of energy to the motor, the last count of the counter 23 remains at the outputs of the counter 23 and, thus, the last correction value is kept at a constant value.

In order to calibrate the offset voltage prior to the starting of the motor, it is advantageous to apply to the clock input 24 of the counter 23 clock pulses which change the correction value until the output signal of the differential amplifier 22 jumps from low to high and vice versa, respectively. At this time, the signal $i_s(t)$ is zero-symmetrical, and calibration is thus completed. This measure is required, however, only if an absolutely correct measurement of the motor current immediately at the start of motor operation is necessary.

We claim:

1. Current-measuring device including a non-contacting current sensor and an evaluating device connected downstream to the sensor for producing an output signal proportional to a current being measured, comprising means for determining a difference in peak values in positive and negative direction of the current being measured, and a circuit arrangement means connected to said means for determining a difference for determining a zero drift of at least one of the evaluating device and the current sensor from symmetrical components of the current being measured and for correcting the drift.

2. Current-measuring device according to claim 1 wherein said circuit arrangement includes a comparison circuit for determining a difference in peak values in positive and negative directions of the current being measured, said difference being a measure of the zero drift.

3. Current-measuring device according to claim 2 including means for storing said peak values and means for forming mean values of said peak values.

4. Current-measuring device according to claim 2 including a controller having an input for receiving a signal corresponding to said difference in said peak values and for forming a correction value for the zero drift.

5. Current-measuring device according to claim 4, wherein said controller comprises a comparator for forming the sign of said difference in said peak values and a counter connected to said comparator for counting in a direction determined by the sign, the count of said counter serving as said correction value.

6. Current-measuring device according to claim 5, including means for maintaining said counter in its original state when the current has no symmetrical components.

7. Current-measuring device according to claim 1, in combination with a four-quadrant power regulator for a resistive-inductive load comprising means for applying a d-c voltage via switching transistors at high frequencies and with varying clock relationship to the load for varying the intensity of the current flowing through the load.

8. Current-measuring device according to claim 1 wherein the current being measured is the motor current of a direct-current motor.

* * * * *